United States Patent [19]
Robinson et al.

[11] Patent Number: 5,762,522
[45] Date of Patent: Jun. 9, 1998

[54] FUSED JAW BLADE FOR WATTHOUR METER SOCKET ADAPTER

[75] Inventors: Darrell Robinson, Highland Township; Allen V. Pruehs, Howell, both of Mich.

[73] Assignee: Ekstrom Industries, Inc., Farmington Hills, Mich.

[21] Appl. No.: 771,242

[22] Filed: Dec. 20, 1996

[51] Int. Cl.$^6$ ............................................. H01R 33/945
[52] U.S. Cl. ............................................. 439/517; 439/146
[58] Field of Search ............................. 439/517, 146, 439/167, 508

[56] References Cited

U.S. PATENT DOCUMENTS

| | | | |
|---|---|---|---|
| 2,606,232 | 8/1952 | W. St. John | 439/508 |
| 3,029,322 | 4/1962 | Waldrop | 200/51.1 |
| 3,806,857 | 4/1974 | Hubeny | 439/508 |
| 4,129,896 | 12/1978 | Young | 439/517 |
| 4,203,645 | 5/1980 | Shennett, Jr. | 439/621 |
| 5,033,973 | 7/1991 | Pruehs et al. | 439/517 |
| 5,129,841 | 7/1992 | Allina et al. | 439/517 |
| 5,577,933 | 11/1996 | Robinson et al. | 439/517 |

OTHER PUBLICATIONS

Litmiter Adapter, Ekstrom Bulletin #3901, Apr. 1, 1974.
Bussmann SPD Electrical Protection Handbook, Fuseology, Jan. 1990.
Bussmann Cable Limiter Applications, p. 25, Jan. 1990.

*Primary Examiner*—P. Austin Bradley
*Assistant Examiner*—T. C. Patel
*Attorney, Agent, or Firm*—Young & Basile, PC

[57] ABSTRACT

A fused jaw blade for use as a line or load jaw blade in a watthour meter socket adapter has a fuse body with a first lug extending from a first end and a second lug in the form of a blade terminal extending from an opposite second end. The second lug or blade terminal is adapted for releasable mounting in a watthour meter socket jaw contact. A jaw contact is formed with the first lug for receiving a blade terminal of a watthour meter or other electrical device therein. The jaw contact is formed by a pair of contact clips mounted on opposite sides of the first lug and having outer ends extending beyond the end of the first lug for receiving a blade terminal therein. Biasing springs are fixedly mounted to the contact clips. Alternately, a single contact clip is fixedly mounted on the first lug to form a complete jaw contact.

15 Claims, 3 Drawing Sheets

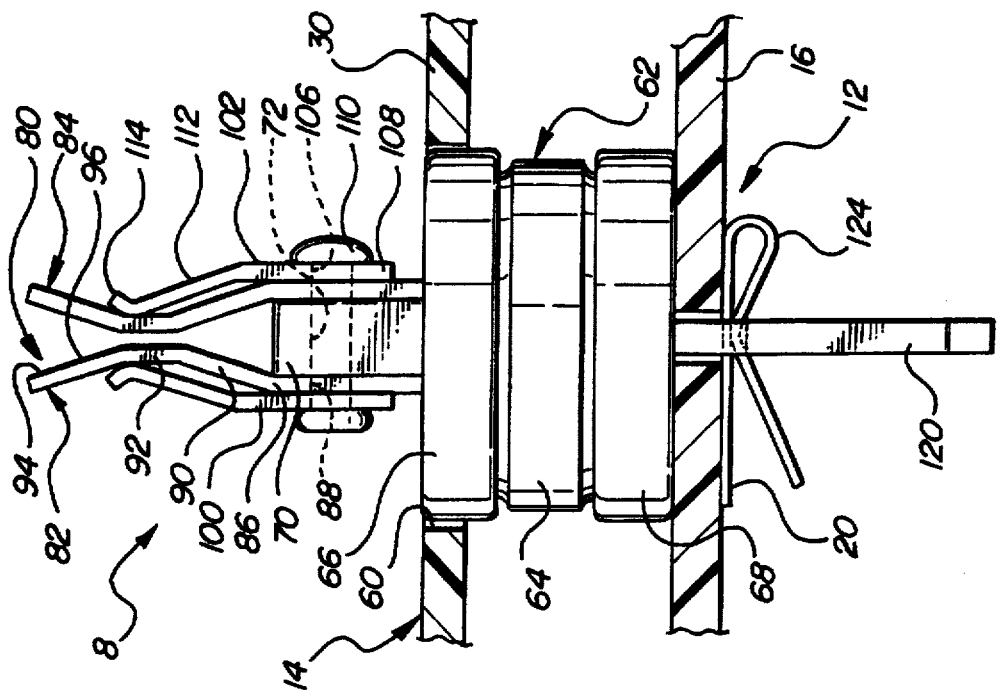
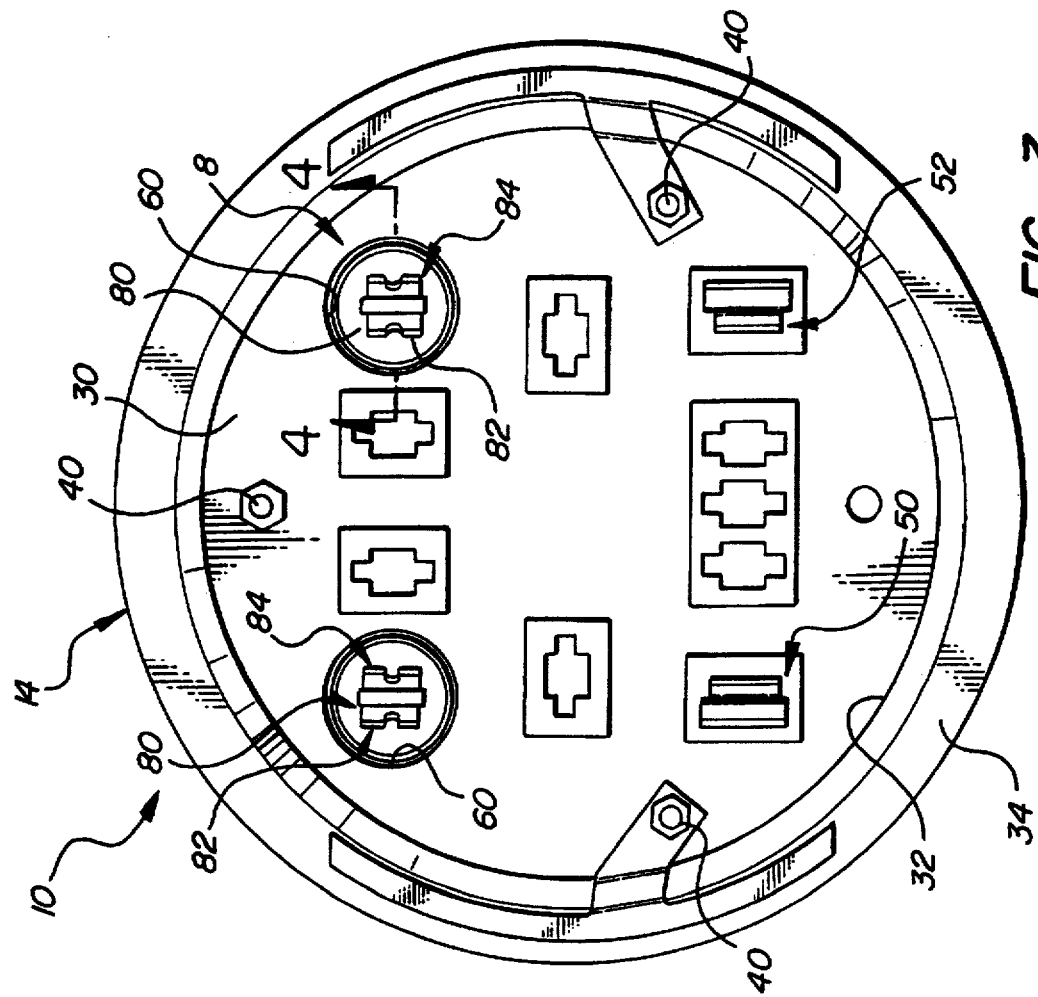

FUSED JAW BLADE FOR WATTHOUR METER SOCKET ADAPTER

BACKGROUND OF THE INVENTION

1. Field of the Invention

The present invention relates, in general, to electrical watthour meters and, specifically, to watthour meter socket adapters.

2. Description of the Art

In the electric utility industry, watthour meters are employed to measure electrical power consumption at a residential or commercial building site. A cabinet is physically mounted on the outside wall of the residence or building and contains a meter socket having pairs of lines and load terminals which are connected to electric power line conductors extending from the utility power network and electric load conductors connected to the residential or building power distribution network. The socket terminals are typically in the form of jaw contacts which receive the blade terminals extending outward from the base of a watthour meter in a snap-in connection to complete an electric circuit through the watthour meter between the line and load terminals mounted in the socket for the measurement of electrical power consumption.

Currently, plug-in watthour meters are widely used. Accordingly, watthour meter socket adapters have been devised to allow the addition of features not originally needed or required in power distribution network. Such watthour meter socket adapters have a plurality of jaw contacts mounted within the interior of a shell to releasibly receive the blade terminals of a watthour meter in a plug-in connection. Blades extend from electrical contact with the jaw contacts in the socket adapter shell through a back wall or base of the socket adapter into a plug-in connection in the jaw terminals in the watthour meter socket.

Watthour meter sockets are provided in a certain amp capacity for a building or home. For example, sockets can provide 100, 150 or 200 amp electrical service to a building or home with typically a fault current withstand rating of 10,000 amps. Frequently, a utility company will upgrade an existing distribution network by providing a more powerful transformer, and higher amperage wiring to homes connected to the particular distribution network. The amount of available fault current capable of being supplied to a given building or home is a function of the transformer size, the distance between the transformer and the building or home, as well as the size of the electrical service conductors. Even though a utility company may upgrade its transformer and underground service, the utility company may not always upgrade an existing socket with a standard fault current withstand rating of 10,000 amps. Therefore, a problem exists since the socket has a lower ampere rating than the maximum fault current the new transformer and service conductors are capable of supplying.

It is also known that the use of socket adapters, by introducing a number of additional electrical connections between the watthour meter blade terminals and the socket jaw terminals, effectively lowers or derates the maximum electrical power supply to a given building or home. Thus, unless provisions are made at the watthour meter socket for the increased electrical power supply to the socket, a potentially dangerous overheating condition may arise at the watthour meter socket.

Various protective devices have been employed in electrical power distribution networks. For example, fuses have been employed to protect electrical devices from overload or short circuits. Pending U.S. patent application Ser. No. 08/404,722, filed Mar. 5, 1995, now U.S. Pat. No. 5,620,337, in the name of Allen V. Pruehs, and entitled Fused Watthour Meter Bypass Storage Adapter, and assigned to the Assignee of the present application, discloses a jumper bypass for a watthour meter socket adapter which includes provisions for mounting one or more fuses between pairs of blade terminals in the socket adapter to bypass a defective or damaged jaw contact in the socket.

It is also known to employ fuses or cable limiters on electrical conductors employed in power distribution networks. Exemplary cable limiters are available from the Bussmann Division, Cooper Industries.

Another use of fuses in watthour meter socket adapters is shown in FIGS. 1 and 2. This development, known as a "limiter adapter" was made by Ekstrom Industries, Inc., the Assignee of the present invention. This limiter adapter employed at least one and preferably a pair of discontinuous jaw contact and blade terminal pairs. Each jaw contact and blade terminal was individually, fixedly mounted to the shell and base of the socket adapter, respectively. A lug or strap was electrically connected to the jaw contact and extended outward therefrom to a bolt-together connection at an opposite end to a fuse. The fuse extended through an opening in the bottom wall of the shell of the adapter and was bolted to a second lug or strap. The second lug was also bolted to an L-shaped extension on the blade terminal. The fuse provided 100/125 amp continuous rating with current limiting of 42,000 max rms ampere rating protection in the watthour meter socket adapter. However, once the fuse was blown due to a short circuit, overcurrent, etc., it was necessary to dismantle a substantial portion of the socket adapter to replace the fuse. This was not only time consuming, but resulted in high labor costs. Further, assembly of the watthour meter with the on board fuse also involved the use of additional components which increased manufacturing and assembly time.

Thus, it would be desirable to provide a means for upgrading the electrical service fault current withstand capability of an existing watthour meter socket without requiring replacement and/or extensive modification to the socket itself. It would also be desirable to provide a means for upgrading the electrical service fault current withstand rating capability of a watthour meter socket adapter which can be installed in existing watthour meter sockets. It would also be desirable to provide such a means which can provide short circuit and overcurrent protection for a watthour meter socket adapter.

SUMMARY OF THE INVENTION

The present invention is a fused jaw blade for use as a line or load jaw blade in a watthour meter socket adapter.

The jaw blade includes an electrical fuse body having first and second opposed ends. A first lug is electrically connected to and extends outward from the first end of the fuse body. A second lug is electrically connected to and extends outward from a second end of the fuse body. The second lug is formed as a watthour meter type blade terminal sized to be releasibly mountable in a watthour meter socket jaw contact. Jaw contact means cooperate with the first lug for forming a jaw contact which releasably receives a watthour meter blade terminal. In one embodiment, the jaw contact means comprises first and second contacts clips mounted on opposite sides of the first lug. The first and second contact clips have outer ends spaced from the end of the first lug and extend angularly toward each other to form a blade terminal receiving slot. Means are provided for fixedly fastening the first and second contact clips to the first lug. Preferably, the fastening means includes aligned apertures formed in the first lug and each of the first and second contact clips, and fasteners, such as rivets, are mounted through the aligned apertures.

In another embodiment, the jaw contact means comprises a single contact clip and the first lug on the fuse body. Fastening means are provided for fixedly coupling the first contact clip to the first lug. The fastening means preferably comprises rivets mountable through aligned apertures in the first contact clip and the first lug.

The present invention also comprises a watthour meter socket adapter having the fused jaw blade described above mounted in the housing of the socket adapter at one or more of the standard line and load jaw blade mounting positions.

The fused jaw blade of the present invention provides short circuit and overcurrent protection for a watthour meter socket adapter as well as the socket, watthour meter, and all electrical equipment and cables on the load side of the supplying utility. The fused jaw blade also enables an existing watthour meter socket to safely handle higher available fault currents without the necessity of replacing an existing watthour meter socket when the utility service to a particular building or home is upgraded.

The present adapter can also be added to a new socket when the available fault current is greater than the standard socket fault current rating. The fused jaw blade of the present invention is simply constructed as a one piece, unitary assembly for a low manufacturing cost. Further, the unitary fused jaw blade can be easily mounted in an existing watthour meter socket adapter, and, also, can be easily and quickly removed therefrom after the fuse has blown.

BRIEF DESCRIPTION OF THE DRAWINGS

The various features, advantages and other uses of the present invention will become more apparent by referring to the following detailed description and drawing in which:

FIG. 3 is a plan elevational view of a watthour meter socket adapter having a fused jaw blade constructed in accordance with the teachings of the present invention mounted therein;

FIG. 4 is an enlarged, cross sectional view generally taken along line 4—4 in FIG. 3;

DESCRIPTION OF THE PREFERRED EMBODIMENTS

Figure 1:
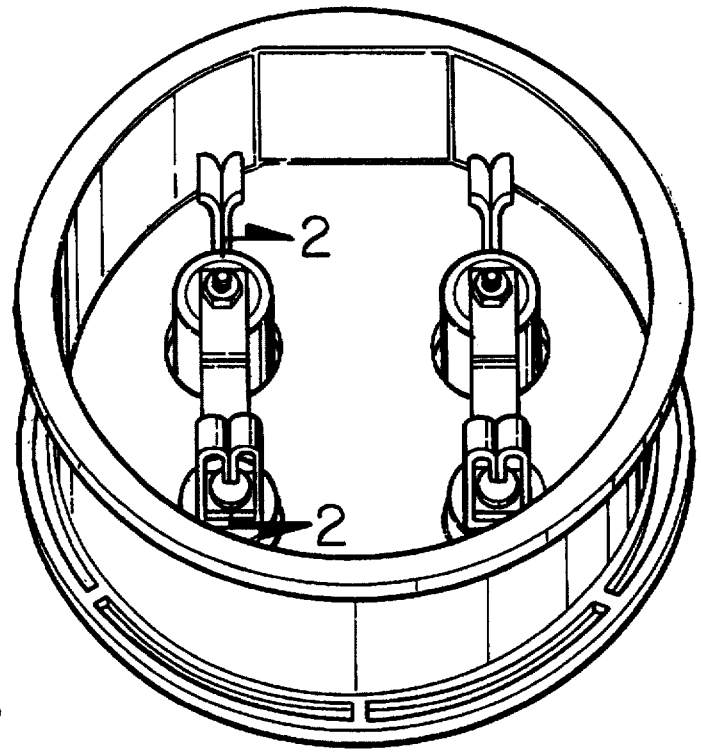
FIG. 1 is a front perspective view of a prior art watthour meter socket adapter.
Figure 2:
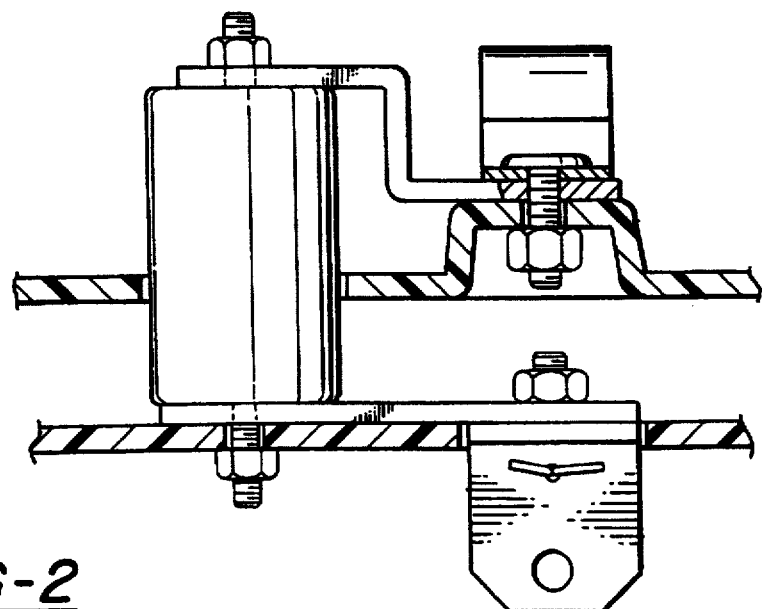
FIG. 2 is a cross sectional view generally taken along line 2—2 in FIG. 1.
Figure 5:
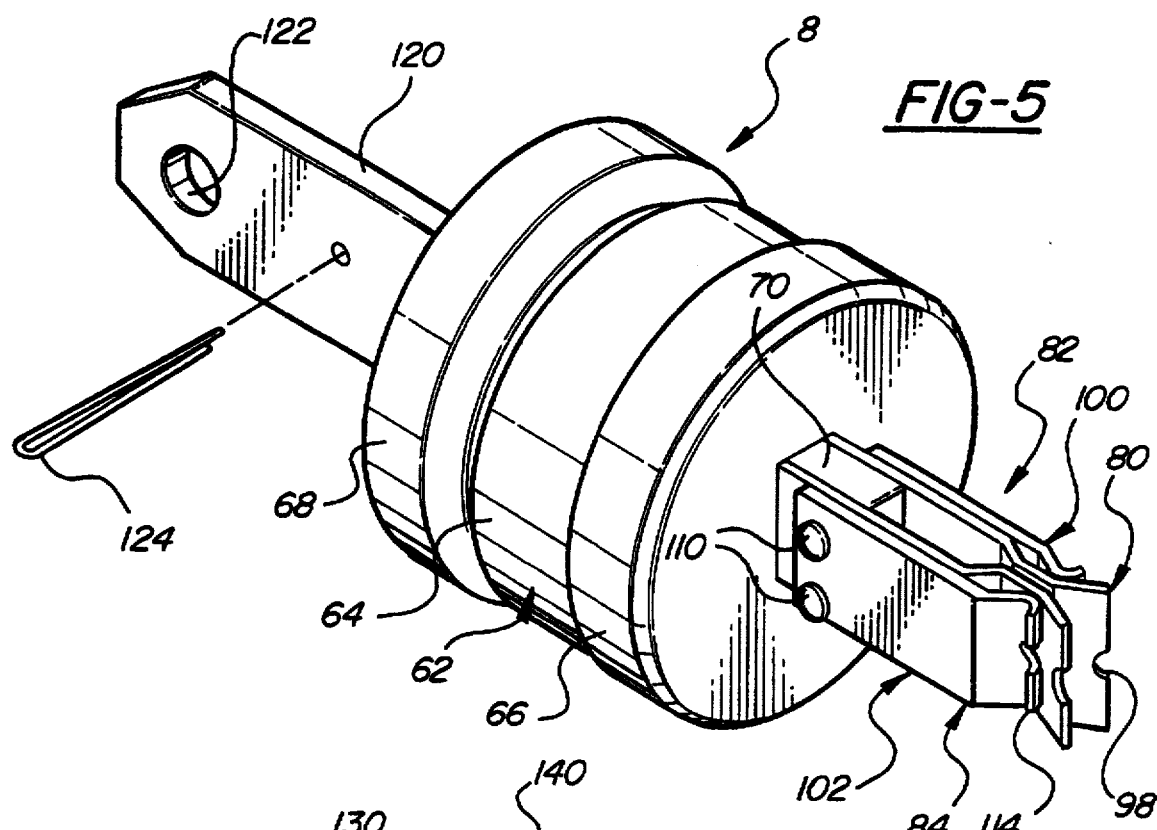
FIG. 5 is a perspective view of the fused jaw blade shown in FIGS. 3 and 4.

Referring now to the drawing, and to FIGS. 3–5 in particular, there is depicted a fused jaw blade 8 mountable in a watthour meter socket adapter 10 which provides short circuit and overcurrent protection for the watthour meter socket adapter 10.

The watthour meter storage adapter 10, hereafter referred to simply as a socket adapter, includes a base 12 and a shell or watthour meter receiving portion 14.

As is conventional, the base 12 has a generally planar, central portion 16 which merges into a raised, enlarged peripheral mounting rim, not shown. A plurality of apertures 20, only one aperture 20 being shown, are formed in the central portion 16 of the base 12 at the standard line and load terminal mounting positions.

Figure 6:
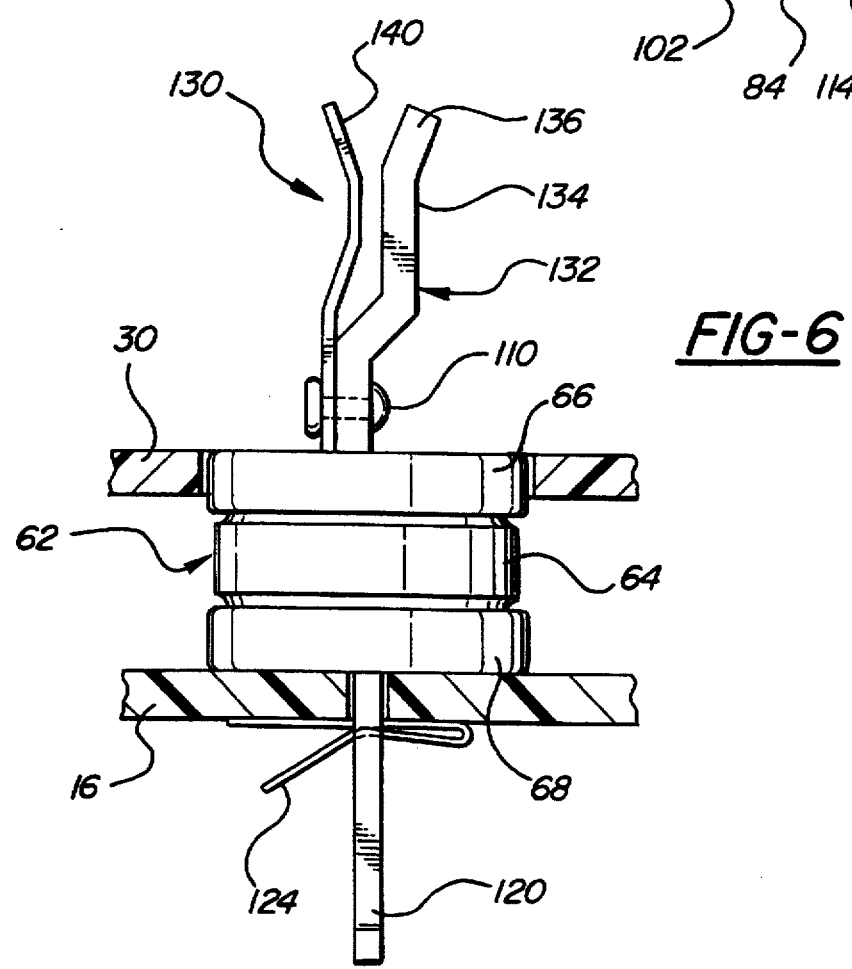
FIG. 6 is a cross sectional view, similar to FIG. 4, but showing an alternate embodiment of a fused jaw blade according to the present invention.

The shell 14 includes a bottom wall 30 having a generally planar configuration. An annular sidewall 32 extends from the periphery of the bottom wall 30 and terminates in an outer, peripheral mounting flange 34 which engages a correspondingly formed mounting flange on a watthour meter, not shown. The bottom wall 30 of the shell 14 is spaced from the central portion 16 of the base 12 to form a cavity therebetween as shown in FIGS. 4 and 6. Fasteners 40 are employed to securely connect the shell 14 to the base 12 in a conventional manner.

In a single phase application shown by example only in FIG. 3, the socket adapter 10 includes a pair of line jaw contacts mounted through apertures in raised bosses formed on the bottom wall 30 of the shell 14 at standard line jaw contact mounting positions by suitable fasteners. A pair of load jaw blades 50 and 52 are mounted at standard load jaw blade mounting positions and extend through the apertures in the central portion 16 of the base 12. The load jaw blades 50 and 52 may be any conventional jaw contact/blade terminal commonly employed in the watthour meter socket adapters. For example, the load jaw blades 50 and 52 may comprise the conventional one piece jaw contact/blade terminal shown in U.S. Pat. No. 5,423,695. Alternately, the load jaw blades may comprise conventional folded over jaw contacts which are integrally connected to linearly extending blade terminals. It will be understood that the fused jaw blade 8 of the present invention may also be employed in three phase watthour meter socket adapters by the use of additional fused jaw blades 8 and/or conventional jaw blades 50, 52. Further, although the fused jaw blades 8 of the present invention are illustrated in FIG. 3 and described hereafter as being employed as the line jaw blade of the socket adapter 10, the fused jaw blades 8 may also be alternately employed as the load jaw blades or as both the line and load jaw blades in the socket adapter 10.

According to the present invention, at least one, and preferably a pair of enlarged apertures 60 are formed in the bottom wall 30 of the shell 14 at one or more of the standard line or load terminal mounting positions. By example only, for the single phase application shown in FIG. 3, two large apertures 60 are formed in the bottom wall 30 of the shell 14 at the standard line jaw contact mounting positions.

As shown in FIGS. 4 and 5, the fused jaw blade 8 includes a fuse 62. The fuse 62 is formed of a generally cylindrical body 64 with first and second ends 66 and 68, respectively, which are fixedly mounted on opposite ends of the cylindrical body 64. By example, the fuse 62 is a type T fuse having a particular ampere rating suited for the needs of a particular electric power application. The fuse 62 may be provided in different ampere and interrupting ratings, such as 200 amps, 200,000 amps interrupting capability, etc.

A conductive tang 70 is fixedly mounted on the first end 66 of the fuse 62 and extends axially outward therefrom. Preferably, the first tang 70 has a generally planer shape with a rectangular cross section. Two bores 72, only one of which is shown in FIG. 4, are formed in the first tang 70, generally adjacent to the end of the first tang 70 joined to the first end 66 of the fuse 62.

A jaw contact means 80 is fixedly mounted to the first tang 70 and forms a jaw contact sized to releasably receive a blade terminal of an electrical device, such as a watthour meter.

The jaw contact means 80 is formed of first and second separate, contact clips 82 and 84 which are mounted on opposite sides of the major surfaces of the first tang 70. As shown in FIGS. 4 and 5, each of the first and second contact clips 82 and 84 has a first, generally planar, flat end portion 86 with at least one and, preferably, a pair of apertures 88 formed therein. The apertures 88 are alignable with corresponding apertures 72 formed in the first tang 70.

A first intermediate portion 90 is formed on each contact clips 82 and 84 and disposed at a predetermined angle from the end portion 86. The first intermediate portion 90 is bent out of the plane containing the flat end portion 86 generally at an angle of approximately 15° with respect to the plane containing the end portion 86. A second intermediate portion 92 disposed at an angle of approximately 5° with respect to the plane containing the end portion 86. Each contact clip 82 and 84 terminates in an outer end portion 94 which is disposed at an angle substantially 15° or more with respect to a plane extending through a blade terminal contact point 96 formed between the end portion 94 and the second intermediate portion 92 and lying generally parallel to the plane containing the end portion 86.

As shown in FIG. 5, a slot 98 is formed in each contact clip 82 and 84 and extends from the outer end portion 94 to a closed end approximate the flat end portion 86. The slot 98 divides each contact clip 82 and 84 into two finger-like contact portions.

Means are provided for biasing each contact clip 82 and 84 toward each other with sufficient force to releasably and securely hold a blade terminal of a watthour meter or other electrical device therebetween in a secure electrical connection. The biasing means preferably comprises first and second spring clips 100 and 102, respectively. One spring clip is provided for each contact clip. Each spring clip 100 and 102 is formed of a suitable biasing material, such as SAE1060 spring steel which is heat treated to 42–44 Rc and then coated with a corrosion resistant material, such as zinc.

As shown in FIGS. 4 and 5, each spring clip, such as spring clip 102, is formed with a flat, central portion 104. At least one and preferably a pair of apertures 106 are formed through the juncture of the central portion 104 and an angled first end 108 and alignable with the apertures 88 in the contact clips 82, 84 and the bores 72 in the first tang 70. Fasteners, such as rivets 110, are mountable through the aligned apertures to fixedly connect the spring clips 100 and 102 and the contact clips 82 and 84 to the first tang 70. Other fasteners, such as nuts and bolts, may also be used.

The first end 108 of each spring clip, such as spring clip 102, is bent or otherwise formed at a predetermined angle from the central portion 104. In a preferred embodiment, the first end 108 is disposed at an angle of approximately 15° from the central portion 104. When the spring clip 102 is mounted in engagement with the contact clip 84, the first end 108 first engages the flat end 86 of the contact clip 84. The central portion 104 of the spring clip 102 will initially be spaced from the contact clip 84 until the rivet 110 forcibly urges and deforms the first end 108 of the spring clip 102 into engagement with end portion 86 of the contact clip 84 and bringing the central portion 104 of the spring clip 102 into registry with the flat end portion 86 of the contact clip 84. This increases the biasing force exerted on the end 108 of the spring clip 102 to form a secure connection between the contact clips 82 and 84 and the first tang 70.

Each spring clip 100 and 102 further includes a second intermediate angled portion 112 which extends from an opposite end of the central portion 104. The second angled portion 112 is also disposed at a predetermined angle from the plane containing the central portion 104. Preferably, this angle is substantially 15° from the plane containing the central portion 104. Finally, each spring clip, such as spring clip 102, is formed with an angularly disposed second end portion 114 which is disposed at an angle of approximately 30° from the juncture 116 of the second end portion 112 and the second angled portion 114. This juncture point 116 forms a contact point in which the spring clip 102 forcibly engages the contact clip 84.

As noted above, the mounting of the rivets 110 through the aligned apertures in the contact clips 82, 84, the spring clips 100, 102 and the first tang 70 deforms the spring clips 100 and 102 into forced engagement with the contact clips 82 and 84. This increases the closure force on the contact clips 82 and 84 so as to enable the contact clips 82 and 84 to form a secure connection with a blade terminal of an electrical device, such as a watthour meter, inserted therebetween.

As shown in FIGS. 4 and 5, a conventionally formed blade terminal 120 is joined to and extends axially outward from the second end 68 of the fuse 62. The blade terminal 120 is formed in a conventional manner as blade terminals used in electric watthour meters or watthour meter socket adapters. Generally, the blade 120 has a generally thin, planar form with an aperture 122 at an outer end. Another aperture adjacent the second end 68 of the fuse 62 receives a suitable fastener, such as a cotter pin 124, therethrough to fixedly mount the blade 120 in the base 12 of the socket adapter 10.

In mounting the fused jaw blade 8 of the present invention in the socket adapter 10, the blade terminal 120 is inserted through the aperture 20 in the central wall 16 of the base 12 until the second end 68 of the fuse 62 seats on the central wall 16 of the base 12. In this mounting position, as shown in FIG. 4, the first end 66 of the fuse 62 is disposed within the enlarged aperture 60 in the bottom wall 30 of the shell 14, with an outer end of the first end 66 generally in line with the bottom wall 30 of the shell 14. The cotter pin 124 fixedly positions the fuse jaw blade 8 in the socket adapter 10.

In this mounting arrangement, the fuse 62 is serially connected between the jaw contact 80 and the blade 120 as well as between a watthour meter blade terminal mounted in the jaw contact 80 and a socket jaw contact in which the blade terminal 120 is mounted.

FIG. 6 depicts an alternate embodiment of a fused jaw blade 130 of the present invention. In this embodiment, the fused jaw blade 130 includes a fuse 62 constructed identically as the fuse 62 described above and shown in FIGS. 3–5. The fuse 62 has a blade terminal 120 extending axially from a second end 68 and mountable in an aperture in the central wall 16 of the base 12 of a watthour meter socket adapter 10. The first end 66 of the fuse 62 is mountable in an enlarged aperture in the bottom wall 30 of the shell 14.

In this embodiment, a jaw contact is formed on the fuse 62 by a first tang 132 which extends from the first end 66 of the fuse 62. The first tang 132 has a generally planar first end 134 joined to the first end 66 of the fuse by suitable means, such as welding, molding, etc. An outer end 136 extends angularly from the first end 134 to aid in guiding a blade terminal of an electrical device into contact with the generally planar first end 134. One half of a jaw contact 140 is fixedly mounted to the first tang 132 by suitable mounting means, such as one or more rivets 110, in the same manner as described above and shown in FIG. 4. The jaw contact 140 may be a single piece member having a multiple angled configuration with an outwardly angled outer end extending oppositely from the outer end 136 on the tang 132. Alternately, a single jaw contact 82 and spring clip 100, as described above and shown FIGS. 4 and 5, may be employed with the first tang 132.

In summary, there has been disclosed a unique, unitary, integral fused jaw blade suitable for use as one of the line and/or load jaw blade terminals in an electrical watthour meter socket adapter. The fuse is electrically serially connected with a jaw contact and a blade terminal carried on the fuse to provide short circuit and overload or overcurrent protection for the watthour meter socket adapter as well as the watthour meter mounted therein and the socket jaw contact and distribution network connected thereto. The fused jaw blade of the present is easily removable from the watthour meter socket adapter after the fuse has blown without requiring any significant dismantling of the socket adapter itself. Further, the fused jaw blade is constructed of a minimal number of separate components for a low manufacturing cost and ease of assembly and maintenance.

What is claimed is:

1. A jaw blade for a watthour meter socket adapter electrically connectable to jaw contacts in a watthour meter socket and receiving blade terminals of a watthour meter in electrical contact therewith, the watthour meter socket adapter including a base and a shell coupled to the base, the jaw blade comprising:

an electrical fuse having first and second opposed ends and first and second conductive lugs;

the first conductive lug extending substantially axially from the first end of the fuse;

the second conductive lug extending substantially axially from the second end of the fuse as a blade terminal adapted to be releasably engageable in a jaw contact of a watthour meter socket; and jaw contact means, joined to the first lug, for forming a jaw contact adapted to releasibly receive a watthour meter blade terminal.

2. The jaw blade of claim 1 wherein the jaw contact means comprises:

first and second contact clips, each having first and second ends; and means for fastening the first ends of the first and second contact clips to opposite sides of the first lug to space the second ends of the first and second contact clips apart to form a blade terminal receiving slot therebetween.

3. The jaw blade of claim 2 wherein the fastening means comprises:

at least one aperture formed in the first lug, and at least one aperture formed in each of the first and second contact clips;

a rivet extendable through the apertures in the first lug and the first and second contact clips to fixedly join the first and second contact clips to the first lug.

4. The jaw blade of claim 2 further comprising:

biasing means, engageable with the first and second contact clips, for biasing outer ends of the first and second contact clips toward each other.

5. The jaw blade of claim 1 wherein the jaw contact means comprises:

a first contact clip having first and second ends; and means for fastening the first end of the first contact clip to the first lug such that the second end of the first contact clip is spaced from an outer end of the first lug to define a blade terminal receiving slot therebetween.

6. The jaw blade of claim 5 further comprising:

the outer end of the first lug extending angularly outward a major extent of the first lug from the first lug.

7. The jaw blade of claim 5 wherein the fastening means comprises:

at least one aperture formed in each of the first lug and the first contact clip; and a fastener fixedly mountable in the at least one aperture in the first lug and the first contact clip to fixedly join the first contact clip and the first lug.

8. A watthour meter socket adapter having a plurality of line and load jaw blades mounted therein, each jaw blade having a jaw contact portion adaptable for receiving a blade terminal of a watthour meter and a blade terminal portion electrically connected to each jaw contact portion and extending from the watthour meter socket adapter for releasible mounting in a jaw contact in a watthour meter socket, at least one of the jaw blades comprising:

an electric fuse having first and second opposed ends and first and second lugs;

the first lug extending substantially axially from the first end of the fuse;

the second lug extending substantially axially from the second end of the fuse as a blade terminal sized to be releasably engageable in a jaw contact of a watthour meter socket; and jaw contact means joined to the first lug, for forming a jaw contact adapted to releasibly receive a watthour meter blade terminal.

9. The watthour meter socket adapter of claim 8 wherein the jaw contact means comprises:

first and second contact clips, each having first and second ends; and means for fastening the first end of the first and second contact clips to the first lug to space the second ends of the first and second contact clips apart to form a blade terminal receiving slot therebetween.

10. The watthour meter socket adapter of claim 9 comprising:

at least one aperture formed in the first lug and in each of the first and second contact clips;

a fastener extendable through the aligned apertures to fixedly join the first and second contact clips to the first lug.

11. The watthour meter socket adapter of claim 9 comprising:

biasing means, engageable with the first and second contact clips, for biasing outer ends of the first and second contacts clips toward each other.

12. The watthour meter socket adapter of claim 8 comprising wherein the jaw contact means comprises:

a first contact clip having first and second ends; and means for fastening the first contact clip to the first lug on the fuse body such that the second end of the first contact clip is spaced from an outer end of the first lug to define a blade terminal receiving slot therebetween.

13. The watthour meter socket adapter of claim 12 comprising:

the outer end of the first lug extending angularly outward from a main portion a major extend of of the first lug.

14. The watthour meter socket adapter of claim 12 comprising:

at least one aperture formed in the first lug and the first contact clip; and a fastener fixedly mountable in the at least one aperture to fixedly join the first contact clip and the first lug.

15. A watthour meter socket adapter having a plurality of line and load jaw blades mounted therein, each jaw blade having a jaw contact portion adaptable for receiving a blade terminal of a watthour meter and a blade terminal portion electrically connected to each jaw contact portion and extending from the watthour meter socket adapter for releasible mounting in a jaw contact in a watthour meter socket, at least one of the jaw blades comprising:

a fuse having first and second opposed ends;

jaw contact means, coaxially carried on the first end of the fuse, for forming a jaw contact adapted to releasible receive a watthour meter blade terminal; and blade terminal means, coaxially carried on the second end of the fuse, adapted to be releasibly engagable in a jaw contact of a watthour meter socket.

* * * * *

UNITED STATES PATENT AND TRADEMARK OFFICE
CERTIFICATE OF CORRECTION

PATENT NO.  : 5,762,522
DATED       : June 9, 1998
INVENTOR(S) : Darrell Robinson, Allen V. Pruehs It is certified that error appears in the above-indentified patent and that said Letters Patent is hereby corrected as shown below:

Column 8, line 2, after "outward", insert --from--.

Column 8, line 3, delete "from the first lug".

Column 8, line 63, delete "main portion a".

Column 8, line 63, after "major" insert --extent--.

Column 8, line 63, delete "extend of".

Signed and Sealed this

Tenth Day of November 1998

Attest:

BRUCE LEHMAN

*Attesting Officer*    *Commissioner of Patents and Trademarks*